US008643999B2

(12) United States Patent
Yeo (10) Patent No.: US 8,643,999 B2
(45) Date of Patent: Feb. 4, 2014

(54) ELECTROMAGNETIC INTERFERENCE REDUCTION APPARATUS

(75) Inventor: Soon Il Yeo, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 353 days.

(21) Appl. No.: 13/211,149

(22) Filed: Aug. 16, 2011

(65) Prior Publication Data

US 2012/0044664 A1    Feb. 23, 2012

(30) Foreign Application Priority Data

Aug. 17, 2010  (KR) .................. 10-2010-0079372
Dec. 27, 2010  (KR) .................. 10-2010-0135660

(51) Int. Cl.
*H02J 7/00* (2006.01)

(52) U.S. Cl.
USPC ............................................. 361/235

(58) Field of Classification Search
USPC ............................................. 361/235
See application file for complete search history.

(56) References Cited

U.S. PATENT DOCUMENTS

| 7,479,886 | B2 * | 1/2009 | Burr ........................... 340/572.7 |
| 8,193,775 | B2 * | 6/2012 | Park et al. ................... 320/134 |
| 8,348,504 | B2 * | 1/2013 | Gregory et al. .............. 374/152 |
| 2005/0186994 | A1 * | 8/2005 | Rahmel et al. ............... 455/572 |
| 2008/0300660 | A1 * | 12/2008 | John ........................... 607/61 |
| 2009/0168305 | A1 * | 7/2009 | Fleig et al. .................. 361/528 |
| 2009/0174361 | A1 * | 7/2009 | Duron et al. ................. 320/101 |
| 2009/0186596 | A1 * | 7/2009 | Kaltsukis .................... 455/404.2 |
| 2010/0270967 | A1 * | 10/2010 | Cho et al. .................... 320/101 |
| 2011/0169372 | A1 * | 7/2011 | Lim ........................... 310/307 |
| 2011/0241624 | A1 * | 10/2011 | Park et al. ................... 320/134 |
| 2011/0252845 | A1 * | 10/2011 | Webb et al. .................. 70/101 |
| 2012/0026726 | A1 * | 2/2012 | Recker et al. ................. 362/157 |
| 2012/0034954 | A1 * | 2/2012 | Tabe ........................... 455/566 |
| 2012/0183097 | A1 * | 7/2012 | Ishizaki ....................... 375/295 |
| 2012/0313612 | A1 * | 12/2012 | Schneider et al. ............. 323/311 |
| 2013/0099676 | A1 * | 4/2013 | Hyoung et al. ............... 315/155 |
| 2013/0118550 | A1 * | 5/2013 | Sahin .......................... 136/246 |
| 2013/0157729 | A1 * | 6/2013 | Tabe ........................... 455/573 |
| 2013/0193847 | A1 * | 8/2013 | Recker et al. ................. 315/86 |

FOREIGN PATENT DOCUMENTS

KR    2001-0061438 A    7/2001

OTHER PUBLICATIONS

Sang Gil Yoon et al., "A Study on the EM Wave Absorber for the Electromagnetic Environment of Indoor Wireless LAN", The Journal of Korea Electromagnetic Engineering Society, vol. 18, No. 11, pp. 1224-1230 (Nov. 2007).

* cited by examiner

*Primary Examiner* — Ronald W Leja
(74) *Attorney, Agent, or Firm* — Rabin & Berdo, P.C.

(57) ABSTRACT

Provided is an Electromagnetic Interference (EMI) reduction apparatus. The EMI reduction apparatus includes: an electromagnetic wave absorbing unit absorbing electromagnetic waves from an electromagnetic wave generator and converting the absorbed electromagnetic waves into thermal energy through thermal conversion and emitting the thermal energy; and a thermoelectric unit converting the emitted thermal energy into electric energy.

10 Claims, 9 Drawing Sheets

ELECTROMAGNETIC INTERFERENCE REDUCTION APPARATUS

CROSS-REFERENCE TO RELATED APPLICATIONS

This U.S. non-provisional patent application claims priority under 35 U.S.C. §119 of Korean Patent Application Nos. 10-2010-0079372, filed on Aug. 17, 2010, and 10-2010-0135660, filed on Dec. 27, 2010, the entire contents of which are hereby incorporated by reference.

BACKGROUND OF THE INVENTION

The present invention disclosed herein relates to an Electromagnetic Interference (EMI) reduction apparatus.

Electromagnetic waves, which may be generated from various electronic devices, are oscillating waves of electric and magnetic fields. Electromagnetic waves may influence the performances or operations of other electronic devices and may cause malfunctions thereof. Furthermore, electromagnetic waves with high and strong frequencies may become the causes of various diseases such as Video Display Terminal (VDT) syndrome.

A typical standard relating to electromagnetic waves in electronics industry is Electromagnetic Compatibility (EMC). The EMC includes an EMI relating to the intensity of electromagnetic waves emitted from electronic devices. Since some electronic devices should meet the EMI standard that government regulates to be sold, it is important to reduce the EMI during a development stage of the electronic devices.

One of methods to reduce electromagnetic wave emission is to use an electromagnetic wave absorber. The electromagnetic wave absorber is an object that absorbs and consumes electromagnetic waves and generally emits heat during a consuming process of electromagnetic waves. However, the heat emission of electronic devices becomes a main factor to cause malfunction thereof sometimes. Accordingly, while an apparatus, which is sensitive to the heat emission, is developed, it is necessary to reduce the heat emission of the electromagnetic wave absorber.

As EMI improvement has been gradually emphasized, a demand on an EMI reduction technique to efficiently resolve the above limitation is urgent.

SUMMARY OF THE INVENTION

The present invention provides an apparatus for reducing electromagnetic interference by absorbing electromagnetic waves from an electronic component.

The present invention also provides an apparatus for reducing heat by converting heat from an electronic component into electric energy.

The present invention also provides an apparatus for providing a part of the driving power of a system by sequentially converting absorbed electromagnetic waves into thermal energy and electric energy.

Embodiments of the present invention provide an Electromagnetic Interference (EMI) reduction apparatus including: an electromagnetic wave absorbing unit absorbing electromagnetic waves from an electromagnetic wave generator and emitting thermal energy through thermal conversion; and a thermoelectric unit converting the emitted thermal energy into electric energy.

In some embodiments, the EMI reduction apparatus may convert a heat generated from operation of an electromagnetic wave generator into electric energy.

In other embodiments, the EMI reduction apparatus further includes a condensing unit storing the electric energy as cumulative charge.

In still other embodiments, the EMI reduction apparatus further includes a power management unit receiving a target signal and selectively outputting the cumulative charge as driving power in response to the target signal.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

It should be construed that the foregoing general illustrations and following detailed description are exemplified and an additional explanation of claimed invention is provided. In entire specification, The meaning of "include," "comprise," "including," or "comprising," specifies a property, a region, a fixed number, a step, a process, an element and/or a component but does not exclude other properties, regions, fixed numbers, steps, processes, elements and/or components. Reference numerals are given in embodiments of the present invention and their examples are shown in the reference drawings. Like reference numbers refer to like elements throughout. Additionally, terms such as " . . . part", " . . . device", and " . . . apparatus" mean units for processing at least one function or operation and those may be realized with hardware, software, or a combination thereof. Embodiments of the present invention will be described with reference to the accompanying drawings in order for those skilled in the art to realize the technical ideals of the present invention without difficulties.

Embodiment of Electromagnetic Interference (EMI) Reduction Apparatus

Figure 1:
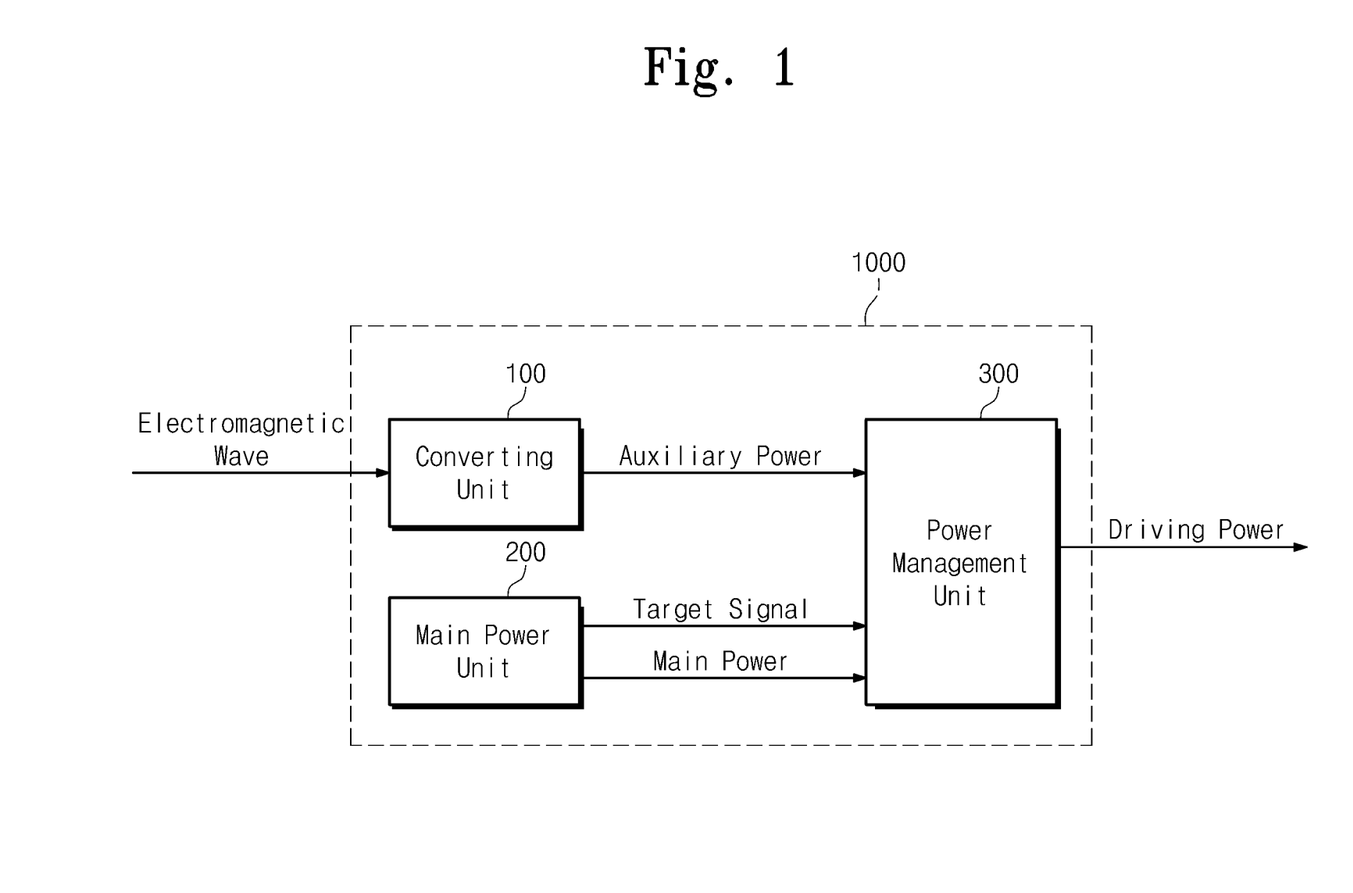
FIG. 1 is a block diagram illustrating an EMI reduction apparatus according to an embodiment of the present invention.

FIG. 1 is a block diagram illustrating an EMI reduction apparatus according to an embodiment of the present invention. Referring to FIG. 1, the EMI reduction apparatus 1000 includes a converting unit 100 and a power management unit

300. A main power supply unit 200 is illustrated to specify the present invention but may be irrelevant to main components of the present invention.

The converting unit 100 absorbs electromagnetic waves from an external device generating the electromagnetic waves and converts the absorbed electromagnetic waves into thermal energy and electric energy. Meanwhile, the converting unit 100 may additionally absorb a heat from operation of an electromagnetic wave generator and converts it into electric energy during the conversion process. The converted electric energy may be stored in a condenser inside the converting unit 100 and may be outputted as auxiliary power according to a control of the power management unit 300. The electromagnetic wave generator may be an electronic component or a semiconductor chip.

The main power supply unit 200 provides main power and a target signal. The target signal provides information for determining a whether the main power is discharged or not.

The power management unit 300 receives main power, auxiliary power, and a target signal and selects one of the main power and the auxiliary power according to the received target signal and outputs the selected one as driving power. In more detail, the power management unit 300 outputs the main power as the driving power during an normal operation state and outputs the auxiliary power as the driving power if the main power is in a discharge state.

According to the above configuration of the present invention, the EMI reduction apparatus absorbs electromagnetic waves and a heat generated from operation from an electromagnetic wave generator, converts them into electric energy, and stores it in a condenser. As a result, the EMI reduction apparatus reduces electromagnetic wave emission and heat emission from an electromagnetic wave generator and provides the stored electric energy as driving energy.

Converting Unit

Figure 2:
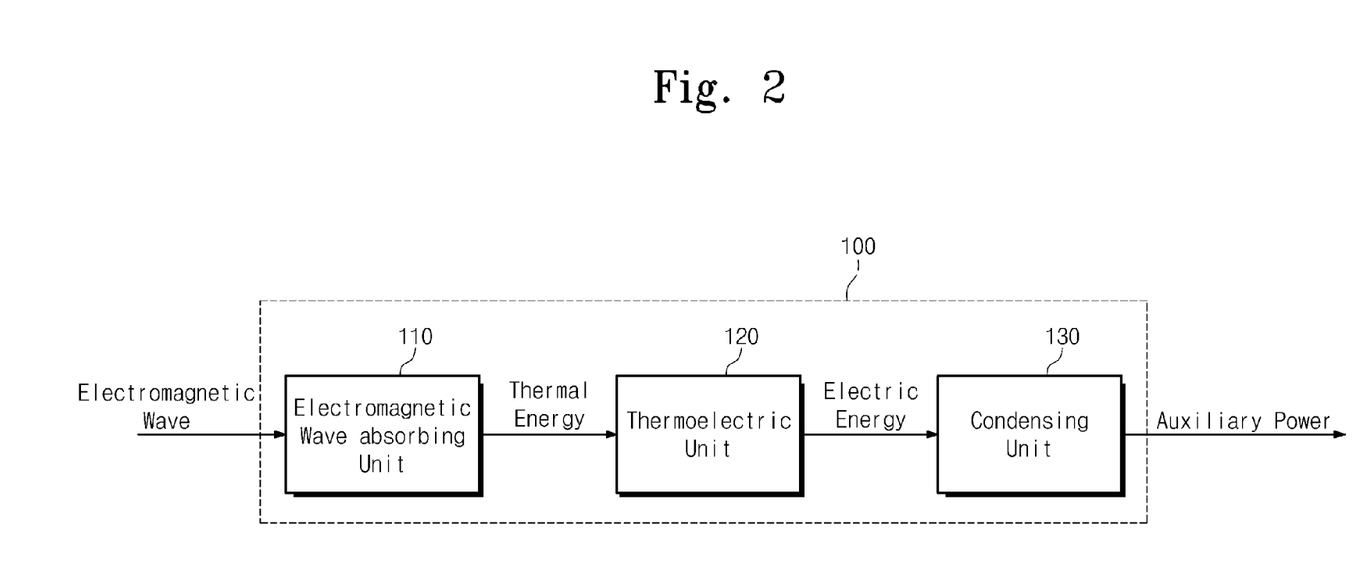
FIG. 2 is a block diagram illustrating a converting unit of FIG. 1.

FIG. 2 is a block diagram illustrating the converting unit 100 of FIG. 1. Referring to FIG. 2, the converting unit 100 includes an electromagnetic wave absorbing unit 110, a thermoelectric unit 120, and a condensing unit 130. The electromagnetic wave absorbing unit 110 absorbs electromagnetic waves and converts them into thermal energy through a thermal conversion process. The thermoelectric unit 120 converts thermal energy from the electromagnetic wave absorbing unit 110 and the heat from operation of components into electric energy through a thermoelectric conversion process and then, outputs it. The condensing unit 130 is connected to the thermoelectric unit 120 and receives current from the thermoelectric unit 120 and accumulates it therein as electric energy. The accumulated electric energy in the condensing unit 130 is outputted as auxiliary power.

Meanwhile, the electric energy generated in the thermoelectric unit 120 may not be stored in the condensing unit 130 but may flow into a ground. However, it is more efficient to store electric energy in the condensing unit 130 in terms of power management.

As a result, the converting unit 100 absorbs electromagnetic waves and a heat from operation of components and converts the absorbed electromagnetic waves and heat into electric energy and then, provides it to the external.

Detailed configurations and operations of the electromagnetic wave absorbing unit 110, the thermoelectric unit 120, and the condensing unit 130 will be described below.

Electromagnetic Wave Absorbing Unit

Figure 3:
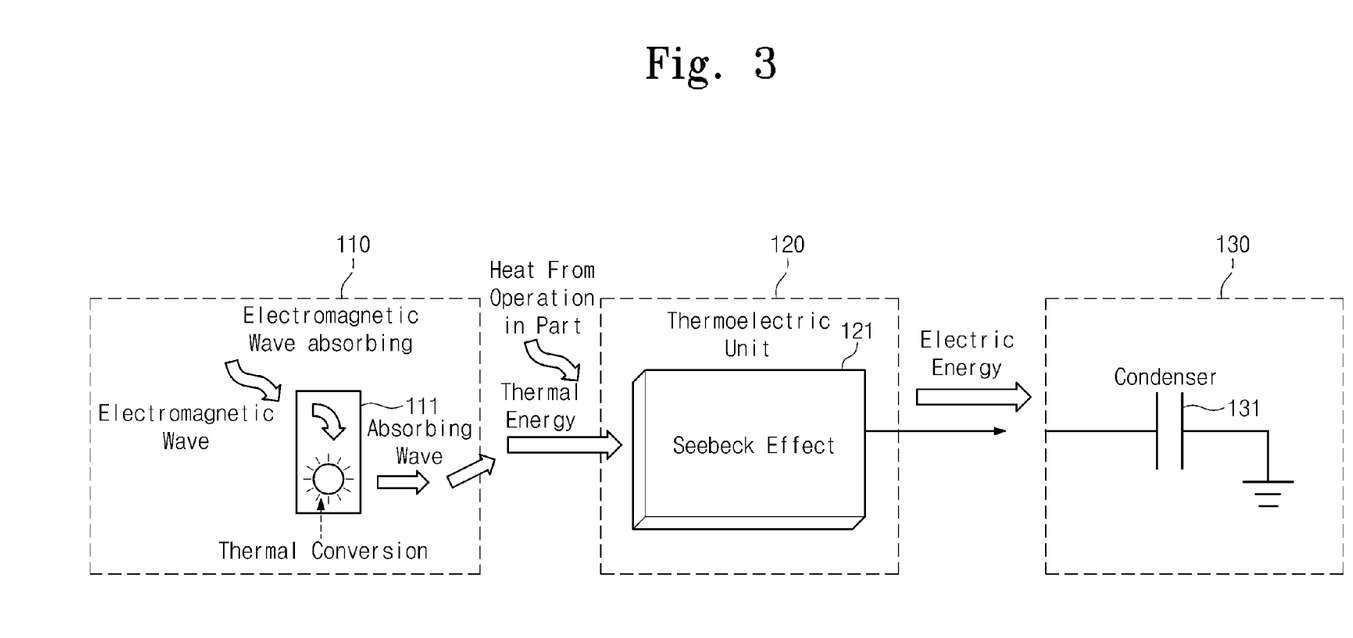
FIG. 3 is a view illustrating operating processes of FIG. 2.

FIG. 3 is a view illustrating operating processes of an electromagnetic wave absorbing unit, a thermoelectric unit, and a condensing unit. Referring to FIG. 3, the electromagnetic wave absorbing unit 110 includes an electromagnetic wave absorber 111. The electromagnetic wave absorber 111 is an object that consumes and reduces electromagnetic energy in electromagnetic waves. The consumed electromagnetic energy is typically converted into heat and then is emitted.

The electromagnetic wave absorber 111 has more excellent electromagnetic wave absorption efficiency as it is closer to an electromagnetic wave generator. In this embodiment, the electromagnetic wave absorber 111 is attached to the rear side of a semiconductor chip or a Printed Circuit Board (PCB) side of a substrate.

As a material of the electromagnetic wave absorber 111, a rubber material coated with carbon and ferrite are typically used and besides those, various materials with an electromagnetic wave absorbing function may be used, if necessary.

Once electromagnetic waves flow into the electromagnetic wave absorber 111, some of the electromagnetic waves are absorbed into the electromagnetic wave absorber 111 and the remaining is transmitted or reflected. The electromagnetic waves absorbed in the Electromagnetic wave absorber 111 generate magnetic flux. At this point, high impedance is induced due to the generated magnetic flux and energy of the electromagnetic waves is converted into thermal energy due to permeability loss, dielectric loss, and conduction loss. At this point, an amount of the converted thermal energy is proportional to a frequency of the absorbed electromagnetic waves, so that the electromagnetic wave absorber 111 emits heat more as it is attached to a component of a high frequency.

There are various kinds of electromagnetic wave absorbers. Examples of the electromagnetic wave absorbers obtained rather easily include absorbers such as NS-HD, NS-H, NS-L, NS-B, and NS-FL, which are manufactured by Changsung Corp. in Korea. The uses of the absorbers are classified according to operating frequencies and permeability.

Thermoelectric Unit

FIG. 3 is a view illustrating operating processes of an electromagnetic wave absorbing unit, a thermoelectric unit, and a condensing unit. Referring to FIG. 3, the thermoelectric unit 120 includes a thermoelectric element 121 having a thermoelectric conversion function.

The thermoelectric conversion means direct energy conversion characteristics for interchangeably converting thermal energy and electric energy in a hetero junction of composite materials. As one kind of the thermoelectric conversion, there is the Seebeck effect obtaining electric energy from thermal energy. The Seebeck effect means a phenomenon in which electromotive force occurs when a temperature difference is applied between both contact points in contact with two kinds of metals or semiconductors having excellent thermoelectric conversion characteristics. In detailed description, heat at a contact point with high temperature is applied to electrons so that an energy level of the electrons is raised. When the electrons become in a high energy state and are freer from crystallization, they move with a jump between electron-holes. Thus, when electrons in materials become free electrons and then move, electron-holes remain where the free-electrons are left. Also, electromotive force occurs due to a gradient in voltage. Such an element converting heat into electric energy through the Seebeck effect is called the thermoelectric element 121.

The thermoelectric element 121 of FIG. 3 has one side contacting the electromagnetic wave absorbing unit 110. Since the electromagnetic wave absorbing unit 110 emits heat by absorbing electromagnetic waves, one side of the thermoelectric element 121 contacting the electromagnetic wave absorbing unit 110 becomes a relatively high temperature area due to thermal conduction. On the contrary, the other side that does not contact the electromagnetic wave absorbing unit 110 becomes a relatively low temperature area. Since the Seebeck effect occurs in the thermoelectric element 121, a voltage difference is generated and electromotive force is formed as long as there is a temperature difference between the high temperature area and the low temperature area. At this point, if there is a current path connecting between the high temperature area and the low temperature area, current may flow through the current path. The current path may be easily formed of a leading wire having a high electrical conductivity. Meanwhile, when electronic components operate, a heat from operation occurs typically. If a portion where the heat from operation occurs and the high temperature area of the thermoelectric element 121 contact each other, the heat from operation may be also converted into electromotive force through the Seebeck effect.

There are various kinds of the thermoelectric elements 121. Examples of the thermoelectric elements obtained rather easily include HMG3730, HMG6064, and HMG1550, which are manufactured by ACETEC Co., Ltd. in Korea. The thermoelectric element 121 so far typically has generation efficiency of less than about 10%. As one example, HMG1550 receives thermal capacity of about 350 watt as an input and provides generation capacity of about 14.7 watt as an output according thereto. The generation amount by the thermoelectric element 121 is greater as a temperature difference between the high temperature area and the low temperature area is greater. Additionally, the thermoelectric element 121 generates electricity as long as heat remains on a system and electromotive force is formed even at a constant temperature. Furthermore, the thermoelectric element 121 has a long life expectancy.

Condensing Unit

FIG. 3 is a view illustrating operating processes of an electromagnetic wave absorbing unit, a thermoelectric unit, and a condensing unit. Referring to FIG. 3, the condensing unit 130 includes a condenser 131. The condenser 131 is connected to the thermoelectric element 121 and accumulates charges introduced from the thermoelectric element 121. Moreover, the charges accumulated in the condenser 131 may be outputted as auxiliary power.

The condenser 131 may include an insulating space between two parallel plates in the simplest case. Besides that, a vacuum capacitor, an MP condenser, or an electric double layer condenser may be used. However, the condenser built in current electronic components or electronic circuits may be integrated into a circuit through semiconductor processes.

Power Management Unit

Figure 4:
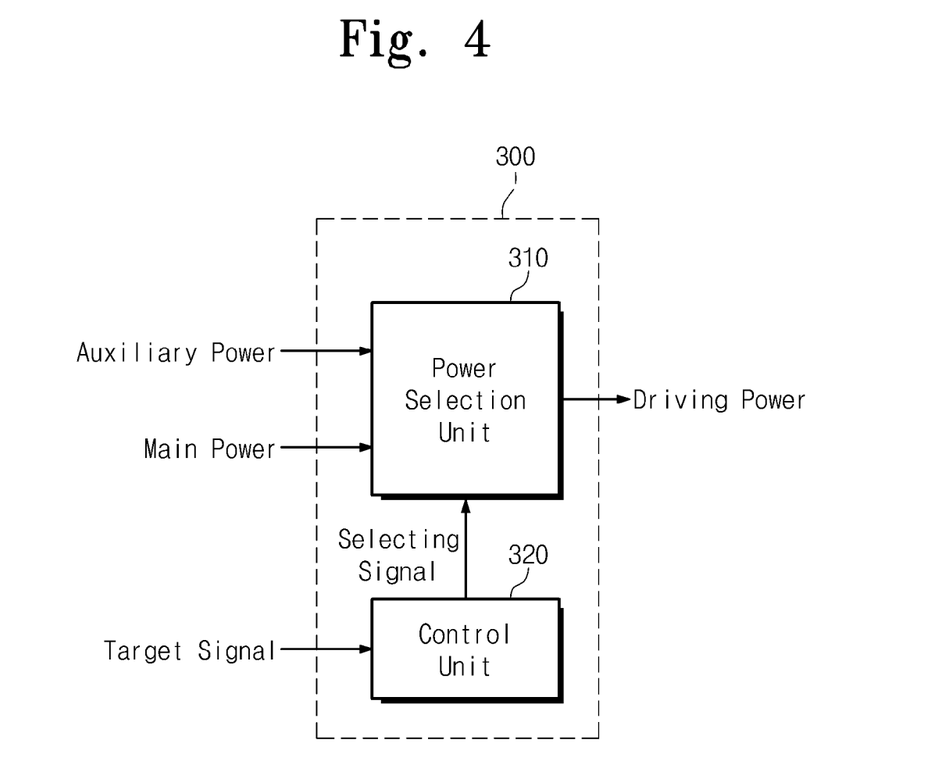
FIG. 4 is a block diagram illustrating a power management unit of FIG. 1.

FIG. 4 is a block diagram illustrating the power management unit 300 of FIG. 1. Referring to FIG. 4, the power management unit 300 includes a power selection unit 310 and a control unit 320.

The control unit 320 of FIG. 4 receives a target signal and outputs a selecting signal. The power selection unit 310 receives auxiliary power, main power, and the selecting signal and selects one of the auxiliary power and the main power according to the selecting signal and then outputs it as driving power.

Detailed configurations and operations of the control unit 320 and the power selection unit 310 will be described below.

Control Unit

Figure 5:
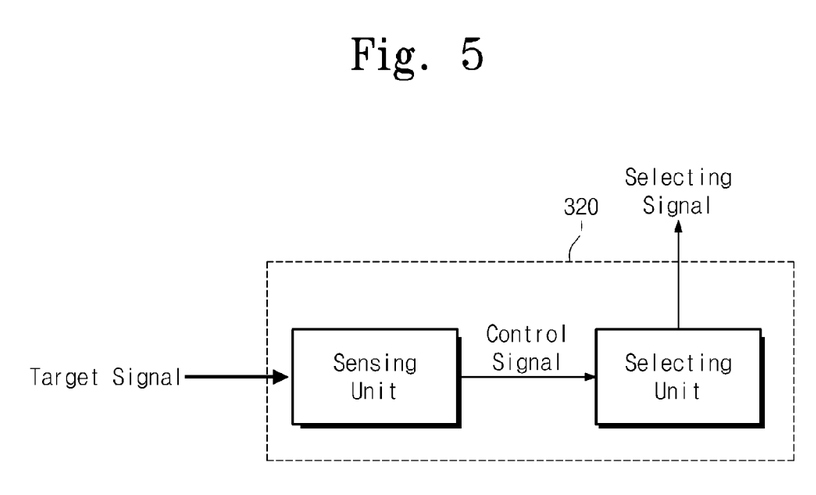
FIG. 5 is a block diagram illustrating a control unit of FIG. 4.

FIG. 5 is a block diagram illustrating the control unit 320 of FIG. 4. Referring to FIG. 5, the control unit 320 includes a sensing unit 321 and a selecting unit 322.

The sensing unit 321 receives a target signal and outputs a control signal according thereto. The selecting unit 322 receives a control signal and outputs a selecting signal according to a value of the control signal. The selecting signal may have a high or low value.

Figure 6:
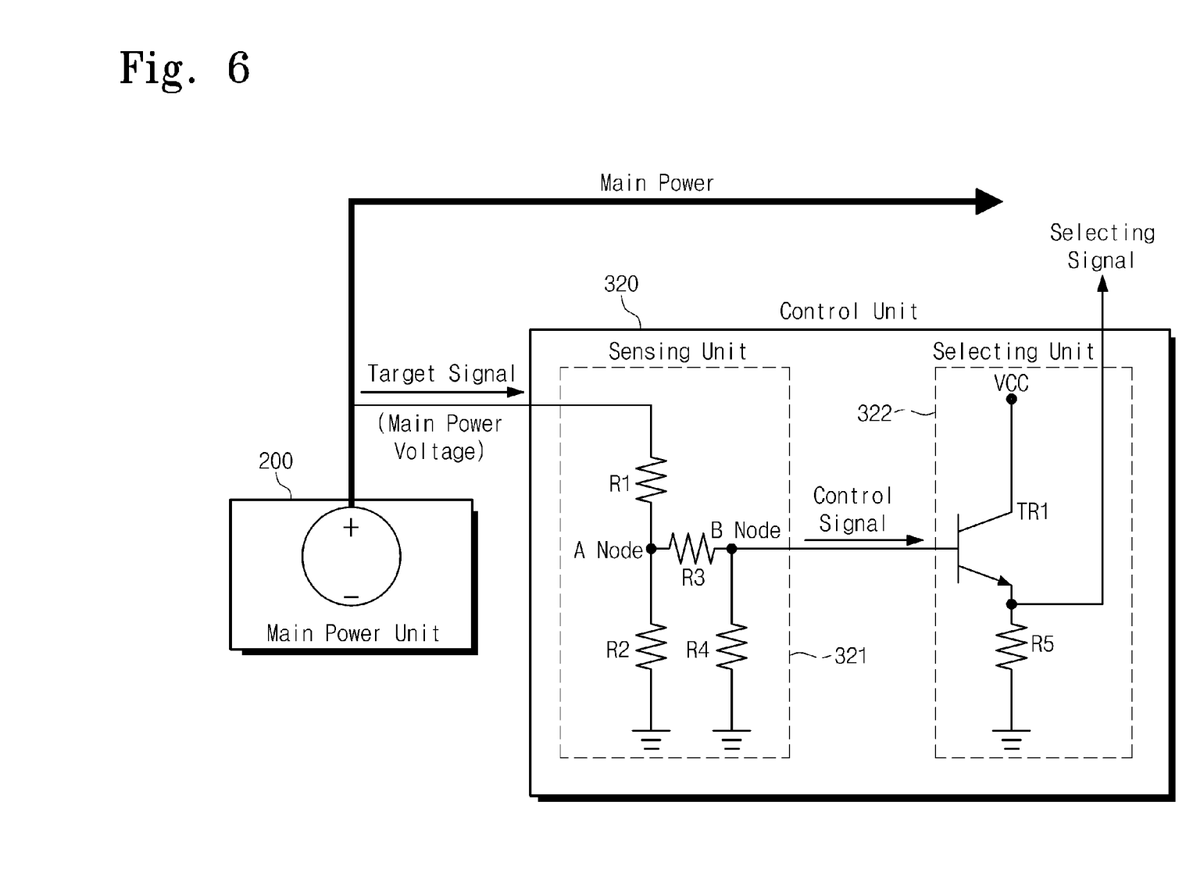
FIG. 6 is a circuit diagram illustrating a sensing unit and a selecting unit of FIG. 5 according to an embodiment of the present invention.

FIG. 6 is a circuit diagram illustrating the sensing unit 321 and the selecting unit 322 according to an embodiment of the present invention. The sensing unit 321 includes resistors R1, R2, R3, and R4. The sensing unit 321 receives a voltage of main power as a target signal. The received voltage is voltage-divided by the resistors R1, R2, R3, and R4 and its values are stored in a node A and a node B, respectively. The voltage of the node B is outputted as a control signal. If the control signal is greater than or equal to a threshold voltage of TR1 (for example, about 0.7 V), TR1 operates and "high" is outputted as a selecting signal. On the contrary, if the control signal is less than the threshold voltage of TR1, TR1 does not operate and "low" is outputted as a selecting signal. A value (hereinafter, referred to as a selection reference value) of the target signal to allow the selecting signal to be outputted with "high" may be adjusted according to values of the resistors R1, R2, R3, and R4.

As a result, the control unit 320 receives a voltage value of main power and outputs a high or low value as a selecting signal according to the received voltage value.

However, the circuit of FIG. 6 is just one example and a circuit outputting a selecting signal differently according to a voltage of main power may be diversely configured. Additionally, it is apparent to those skilled in the art that a circuit receiving a current of main power as a target signal and outputting a selecting signal according thereto may be configured without difficulties.

Power Selection Unit

Figure 7:
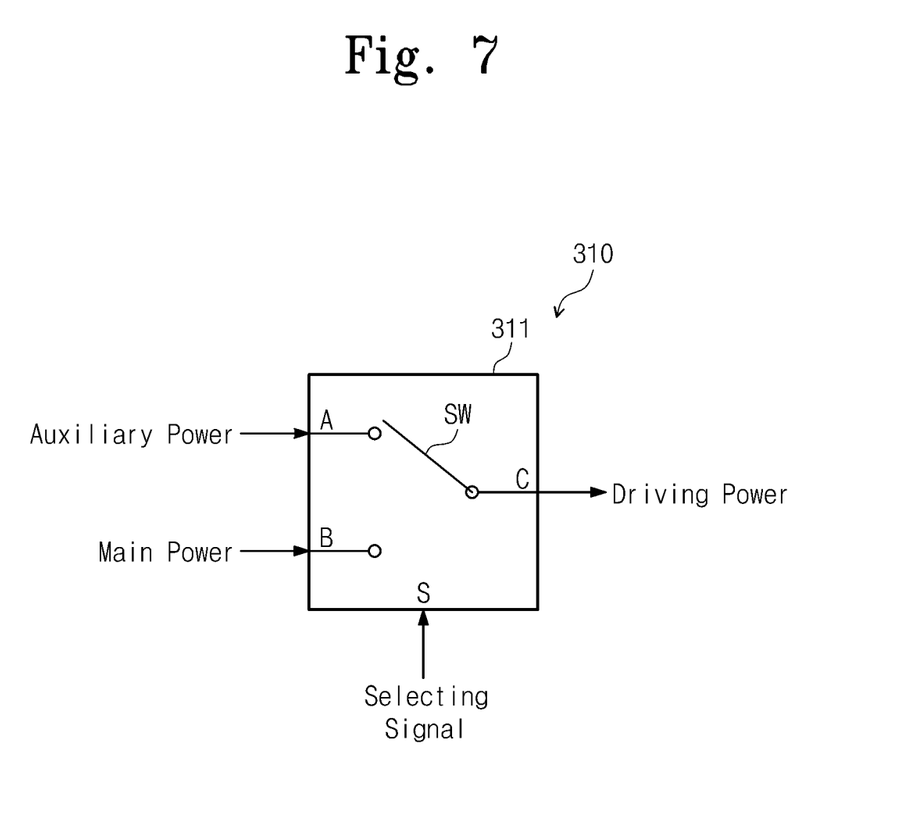
FIG. 7 is a view illustrating a power selection unit of FIG. 4.

FIG. 7 is a view of the power selection unit 310 of FIG. 4. Referring to FIG. 7, the power selection unit 310 includes a switch unit 311 that selectively connects two inputs with one output. Moreover, the switch unit 311 may be a multiplexer having two inputs and one output.

The power selection unit 310 receives auxiliary power A, main power B, and a selecting signal S as an input. The selecting signal S may have a high or low value. If the selecting signal S is high, a switch SW is switched into the node B of FIG. 6 and the main power B is outputted as driving power C. If the selecting signal S is low, the switch SW is switched into the node A of FIG. 6 and then, the auxiliary power A is outputted as the driving power C.

As a result, the power selection unit 310 selects one of the main power and the auxiliary power according to a value of the selecting signal and outputs it as driving power.

On the basis of operations of the control unit 320 and the power selection unit 310, if a voltage of the main power is greater than or equal to a selection reference value, the control unit 320 selects "high" as a selecting signal. Since the selecting signal is "high", the switch SW in the power selection unit 310 connects the main power with the driving power. On the contrary, if the voltage of the main power is less than the selection reference value, the control unit 320 outputs "low" as a selecting signal. Since the selecting signal is "low", the switch SW in the power selection unit 310 connects the auxiliary power with the driving power. At this point, the selection reference value may be designated with a voltage value with which the main power becomes in a discharge state. That is, according to whether the main power is discharged or not, the power management unit 300 serves to selectively output auxiliary power as driving power.

EMI Reduction Method According to Embodiment

Figure 8:
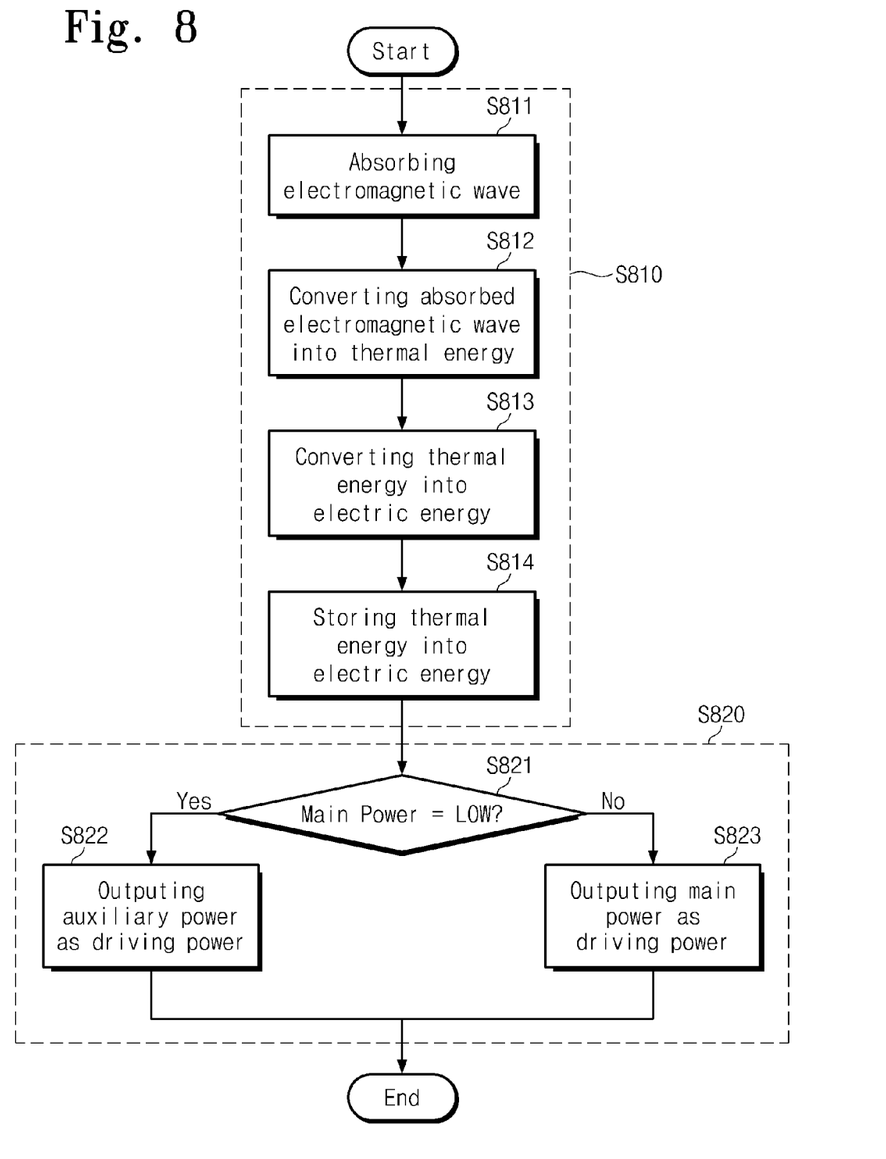
FIG. 8 is a flowchart illustrating a method of absorbing electromagnetic waves according to an embodiment of the present invention.

FIG. 8 is a flowchart illustrating an EMI reduction method according to an embodiment of the present invention. In operation S810 of FIG. 8, electromagnetic waves and a heat from operation are absorbed, energy is converted, and then electric energy is stored. In operation S820, driving power is selected.

Referring to operation S810, the absorption of electromagnetic waves and a heat from operation, the energy conversion, and the electric energy storing operation are performed as in the following order. In operation S811, the electromagnetic wave absorber 111 of FIG. 3 absorbs electromagnetic waves from an electromagnetic wave generator. The absorption of the electromagnetic waves may be performed using the electromagnetic wave absorber 111 formed of a material such as carbon or ferrite. In operation S812, the absorbed electromagnetic waves are converted into heat. The absorbed electromagnetic waves are consumed in the electromagnetic wave absorber 111 due to permeability loss, dielectric loss, and conduction loss and the various losses are emitted as heat. That is, energy that the electromagnetic waves have is converted into thermal energy and then is emitted. In operation S813, the heat emitted from the electromagnetic wave absorber 111 is converted into electric energy. Moreover, the heat from operation occurring during an operation of the electromagnetic wave generator is converted into electric energy also. The thermoelectric element 121 of FIG. 3 absorbs the emission heat and the heat from operation in the high temperature area. The absorbed heat raises an energy level of electrons and forms electromotive force through the Seebeck effect. In operation S814, the electromotive force is stored in the condenser 131 of FIG. 3 through a current path. A storage form of the electromotive force may vary but the electromotive force is typically stored as cumulative charge. The condenser 131 may be diversely configured but may include two parallel metal plates in the simplest case.

Referring to operation S820, an operation of selecting driving power is performed as in the following order. In operation S821, the sensing unit 321 of FIG. 5 receives a target signal from the main power unit 200 of FIG. 1. The target signal may be a current value or a voltage value of the main power unit 200. A corresponding control signal is outputted to the selecting unit 322 of FIG. 5 according to the received target signal. The selecting unit 322 outputs a high or low value as a selecting signal according to the control signal. In operation S822, the power selection unit 310 of FIG. 7 receives the selecting signal and, if the selecting signal has a low value, outputs auxiliary power as driving power. In operation S823, the power selection unit 310 outputs main power as driving power if the selecting signal has a high value.

Through the above operations, the electromagnetic waves and the heat from operation of the electromagnetic wave generator are converted into electric energy and then are stored. Additionally, the stored electric energy may be used as an auxiliary power of a system to provide driving power.

Embodiment when EMI Reduction Apparatus is Applied to Semiconductor Chip

Figure 9:
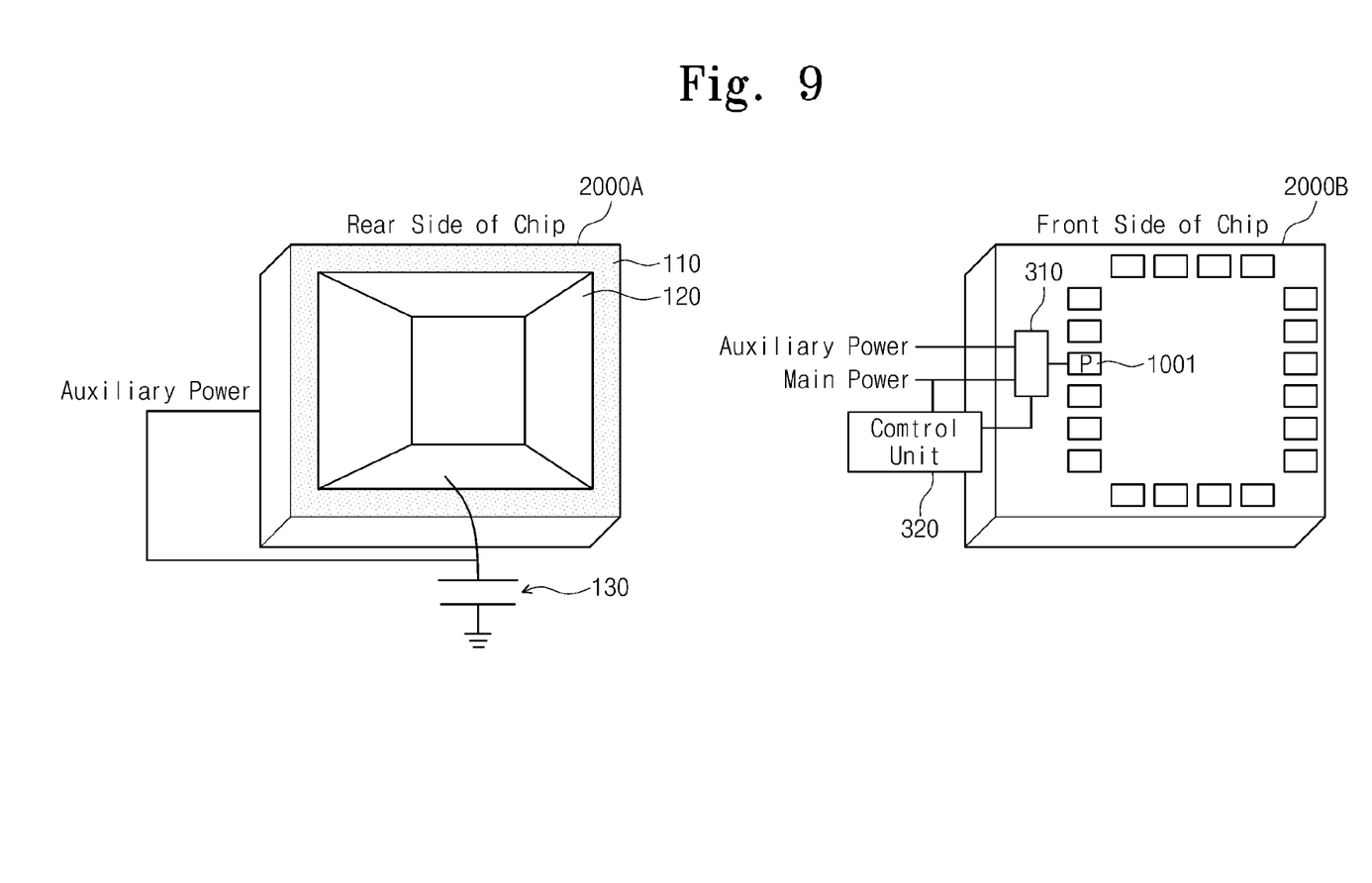
FIG. 9 is a view when an EMI reduction apparatus is applied to a semiconductor layer.

FIG. 9 is a view when the EMI reduction apparatus 1000 is applied to a semiconductor chip. Referring to FIG. 9, an electromagnetic wave absorber 110 and a thermoelectric unit 120 are sequentially attached to the rear side 2000A of the semiconductor chip. One side of the thermoelectric unit 120 contacting the electromagnetic wave absorber 110 is a high temperature area. The thermoelectric unit 120 is connected to a condensing unit 130 through a leading wire. The condensing unit 130 may be directly attached on the thermoelectric unit 120 or may be mounted on the front side 2000B of the semiconductor chip or a PCB having the semiconductor chip mounted. A power selection unit 310 and a control unit 320 may be attached to the front side 2000B of the semiconductor chip. An output of the power selection unit 310 is connected to a power supply pin 1001 of the semiconductor chip to provide driving power.

Additionally, the EMI reduction apparatus 1000 may be attached on a PCB side of a substrate. The electromagnetic wave absorber 110, the thermoelectric unit 120, the condensing unit 130, the power selection unit 310, and the control unit 320 are mounted on the front or rear of the substrate PCB. Here, an output of the power selection unit 310 and the power supply pin 1001 of the semiconductor chip are connected to each other so that the EMI reduction apparatus 1000 may be realized on the substrate PCB.

Meanwhile, electromagnetic waves and a heat from operation occurring in the semiconductor chip are converted into electric energy and detailed operations and processes of using auxiliary power are mentioned above according to the embodiments of the EMI reduction apparatus.

As mentioned above, according to embodiments of the present invention, since electromagnetic waves from an electronic component are efficiently absorbed, EMI can be reduced.

Also, according to embodiments of the present invention, since a heat from an electronic component is converted into electric energy, a cooling effect occurs and heat emission of the electronic component can be drastically improved.

Also, according to embodiments of the present invention, electric energy is generated and accumulated from the absorbed electromagnetic waves, the generated electric energy can be used as a part of the driving power of a system.

The above-disclosed subject matter is to be considered illustrative, and not restrictive, and the appended claims are intended to cover all such modifications, enhancements, and other embodiments, which fall within the true spirit and scope of the present invention. For example, selecting of materials and elements of an electromagnetic wave absorber and a thermoelectric unit or detailed circuit configurations of a power management unit or connection relationship between front and rear stages may be diversely amended or modified according to their uses. Thus, to the maximum extent allowed by law, the scope of the present invention is to be determined by the broadest permissible interpretation of the following claims and their equivalents, and shall not be restricted or limited by the foregoing detailed description.

What is claimed is:

1. An Electromagnetic Interference (EMI) reduction apparatus comprising:
    an electromagnetic wave absorbing unit absorbing electromagnetic waves from an electromagnetic wave generator and emitting thermal energy through thermal conversion; and
    a thermoelectric unit converting the emitted thermal energy into electric energy.

2. The EMI reduction apparatus of claim 1, wherein the electromagnetic wave absorbing unit comprises a carbon or ferrite material.

3. The EMI reduction apparatus of claim 1, wherein the thermoelectric unit converts a heat from operation of the electromagnetic wave generator into the electric energy.

4. The EMI reduction apparatus of claim 1, wherein the thermoelectric unit contacts the electromagnetic wave absorbing unit and comprises a thermoelectric element using the Seebeck effect.

5. The EMI reduction apparatus of claim 1, further comprising a condensing unit storing the electric energy as cumulative charge.

6. The EMI reduction apparatus of claim 5, wherein the condensing unit is connected to the thermoelectric unit and comprises a capacitor cumulatively accumulating charge coming from the thermoelectric unit.

7. The EMI reduction apparatus of claim 5, further comprising a power management unit receiving a target signal and selectively outputting the accumulated charge as driving power in response to the target signal.

8. The EMI reduction apparatus of claim 7, wherein the power management unit comprises:
   a control unit receiving the target signal and outputting a selecting signal corresponding to the target signal; and
   a power selection unit selectively outputting the accumulated charge as the driving power in response to the selecting signal.

9. The EMI reduction apparatus of claim 8, wherein the power selection unit comprises a switch unit having both two inputs and one output.

10. The EMI reduction apparatus of claim 8, wherein the control unit comprises:
   a sensing unit receiving a voltage of main power as the target signal and outputting a signal corresponding to the received voltage as a control signal; and
   a selecting unit receiving the control signal and outputting "high" or "low" as the selecting signal in response to the control signal.

* * * * *